United States Patent [19]
Okuno

[11] Patent Number: 5,466,949
[45] Date of Patent: Nov. 14, 1995

[54] SILICON OXIDE GERMANIUM RESONANT TUNNELING

[75] Inventor: Yasutoshi Okuno, Tsukuba, Japan

[73] Assignee: Texas Instruments Incorporated, Dallas, Tex.

[21] Appl. No.: 286,067

[22] Filed: Aug. 4, 1994

[51] Int. Cl.$^6$ .......................... H01L 29/16; H01L 29/737
[52] U.S. Cl. .................. 257/25; 257/19; 257/22
[58] Field of Search ................... 257/25, 19, 22

[56] References Cited

U.S. PATENT DOCUMENTS 5,216,262  6/1993  Tsu ............................................. 257/25

OTHER PUBLICATIONS

*IEEE Trans on Elec. Dev.* vol. 39 No. 1 Jan. 1992 Nayak et al, "Rapid Isothermal . . . Layers".
K. Prabhakaran, T. Nishioka, K. Sumitomo, Y. Kobayashi and T. Ogino; In Situ Oxidation of a Thin Layer of Ge on Si(001): Observation of GeO to SiO$_2$ Transition; *Applied Physics Letter* 62(8); Feb. 1993; pp. 864–865.

*Primary Examiner*—Jerome Jackson
*Attorney, Agent, or Firm*—Carlton H. Hoel; Richard L. Donaldson

[57] ABSTRACT

A resonant tunneling diode (400) made of a germanium quantum well (406) with silicon oxide tunneling barriers (404, 408). The silicon oxide tunneling barriers (404, 408) plus germanium quantum well (406) may be fabricated by oxygen segregation from germanium oxides to silicon oxides.

5 Claims, 7 Drawing Sheets

9b 7b

12b 5,466,949

SILICON OXIDE GERMANIUM RESONANT TUNNELING

BACKGROUND OF THE INVENTION

The invention relates to electronic devices, and, more particularly, to resonant tunneling devices and systems.

The continual demand for enhanced transistor and integrated circuit performance has resulted in improvements in existing devices, such as silicon bipolar and CMOS transistors and gallium arsenide MESFETs, and also in the introduction of new device types and materials. In particular, scaling down device sizes to enhance high frequency performance leads to observable quantum mechanical effects such as carrier tunneling through potential barriers. This led to development of alternative device structures such as resonant tunneling diodes and resonant tunneling hot electron transistors which take advantage of such tunneling phenomena.

Resonant tunneling diodes are two terminal devices with conduction carriers tunneling through potential barriers to yield current-voltage curves with portions exhibiting negative differential resistance. Recall that the original Esaki diode had interband tunneling (e.g., from conduction band to valence band) in a heavily doped PN junction diode. An alternative resonant tunneling diode structure relies on resonant tunneling through a quantum well in a single band; see FIG. 1 which illustrates a AlGaAs/GaAs quantum well. Further, Mars et al., Reproducible Growth and Application of AlAs/GaAs Double Barrier Resonant Tunneling Diodes, 11 J.Vac. Sci.Tech. B 965 (1993), and Özbay et al, 110 GHz Monolithic Resonant-Tunneling-Diode Trigger Circuit, 12 IEEE Elec. Dev.Lett. 480 (1991), each use two AlAs tunneling barriers imbedded in a GaAs structure to form a quantum well resonant tunneling diode. The quantum well may be 4.5 nm thick with 1.7 nm thick tunneling barriers. FIG. 2 illustrates current-voltage behavior at room temperature. Note that such resonant tunneling "diodes" are symmetrical. With the bias shown in FIG. 3a, a discrete electron level (bottom edge of a subband) in the quantum well aligns with the cathode conduction band edge, so electron tunneling readily occurs and the current is large. Contrarily, with the bias shown in FIG. 3b the cathode conduction band aligns between quantum well levels and suppresses tunneling, and the current is small.

Attempts to fabricate quantum wells in silicon-based semiconductors, rather than the III–V semiconductors such as AlGaAs and GaAs, have focused primarily on silicon-germanium alloys. For example, the Topical Conference on Silicon-Based Heterostructures II (Chicago 1992) included papers such as Griitzmacher et al., Very Narrow SiGe/Si Quantum Wells Deposited by Low-Temperature Atmospheric Pressure Chemical Vapor Deposition, 11 J.Vac.Sci. Tech. B 1083 (1993)(1 nm wide wells of $Si_{0.75}Ge_{0.25}$ with 10 nm wide Si tunneling barriers) and Sedgwick et al., Selective SiGe and Heavily As Doped Si Deposited at Low Temperature by Atmospheric Pressure Chemical Vapor Deposition, 11 J.Vac. Sci. Tech. B 1124 (1993)(Si/SiGe resonant tunneling diode selectively grown in an oxide window with silicon tunneling barriers each 5 nm wide and a 6 nm wide quantum well of $Si_{0.75}Ge_{0.25}$. Because the valence band offset greatly exceeds the conduction band offset at SiGe/Si interfaces, most investigators consider hole tunneling rather than electron tunneling using strained layer SiGe.

However, SiGe strained layers possess a serious intrinsic impediment in that the band discontinuities are small (less than 500 meV). This precludes room temperature operation with large peak-to-valley current differences (greater than approximately 5).

Tsu, U.S. Pat. No. 5,216,262, describes a silicon-based quantum well structure with tunneling barriers made of short period silicon/silicon dioxide superlattices of epitaxial silicon dioxide two monolayers thick.

Numerous investigators have noted the segregation of oxygen from germanium oxides to silicon oxides ($GeO_x$+ $Si$>$Ge$+$SiO_x$ and $2GeO$+$Si$>$2Ge$+$SiO_x$) during thermal annealing. For example, Prabhakaran et al, In Situ Oxidation of a Thin Layer of Ge on Si(001): Observation of GeO to $SiO_2$ Transition, 62 Appl. Phys. Lett. 864 (1993).

SUMMARY OF THE INVENTION

The present invention provides fabrication methods and silicon-compatible resonant tunneling structures with silicon oxide tunneling barriers about a germanium quantum well. The methods of fabrication include segregation of oxygen from germanium oxides to silicon oxides to form the quantum well and tunneling barriers.

BRIEF DESCRIPTION OF THE DRAWINGS

The drawings are schematic for clarity.

FIGS. 9a–e show fabrication steps of the second preferred embodiment diode.

FIGS. 12a–c show a memory cell application of the preferred embodiment diodes.

DESCRIPTION OF THE PREFERRED EMBODIMENTS

First preferred embodiment resonant tunneling diode

Figure 4:
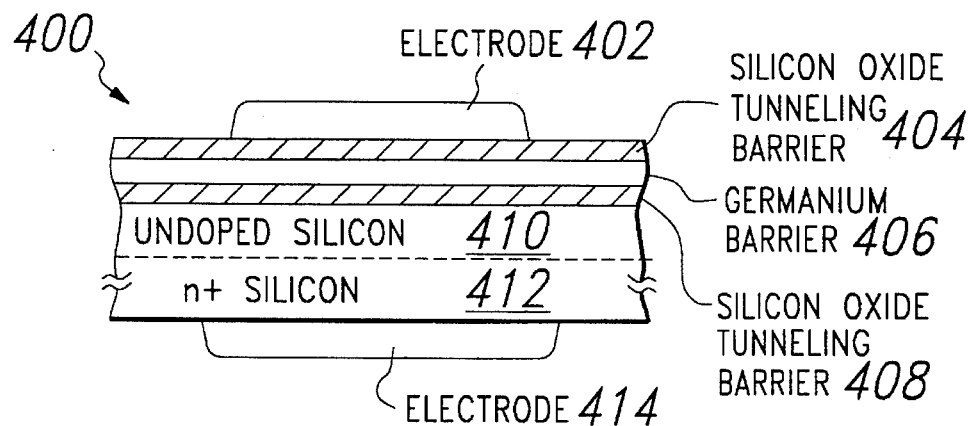
FIG. 4 illustrates a first embodiment diode in cross sectional elevation view.

FIG. 4 shows first preferred embodiment resonant tunneling diode, generally denoted by reference numeral 400, in cross sectional elevation and plan views as including metal anode 402, silicon dioxide ("oxide") tunneling barrier 404, germanium quantum well 406, oxide tunneling barrier 408, undoped silicon layer 410, n+ silicon substrate 412, and metal electrode 414. Tunneling barriers 404/408 are each about 1 nm thick (roughly 4 molecular layers and amorphous) with transition layers and about 10 μm by 10 μm. Quantum well 406 is about 1.5 nm thick. Note that the thickness of barriers 404/408 primarily impacts the tunneling current magnitude; the quantum well width primarily determines the quantized energy levels in the quantum well.

Also, the exact electronic and chemical nature of the tunneling barriers varies through the barrier, so FIG. 4 should be taken as heuristic.

Figure 5A:
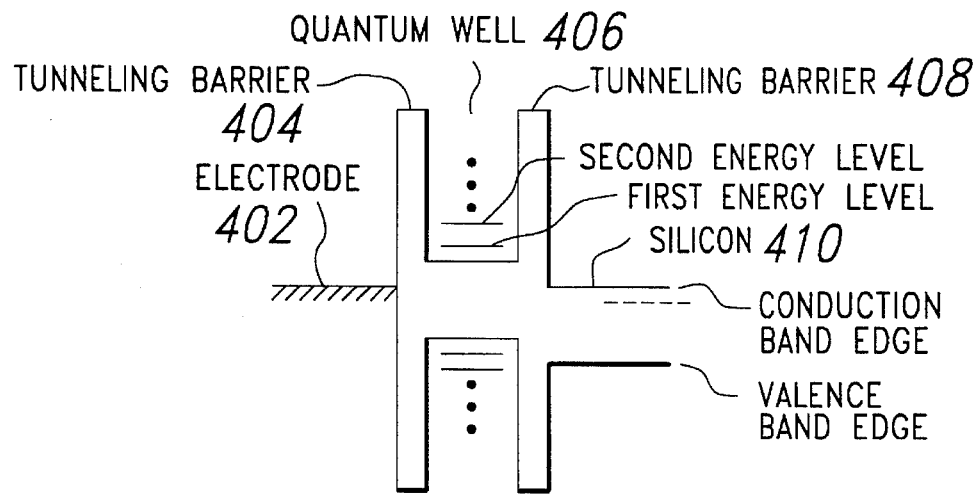
FIGS. 5a–c are band diagrams for the first preferred embodiment diode with various biases.
Figure 5B:
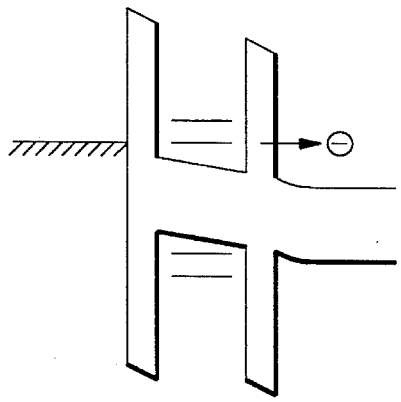
Figure 5C:
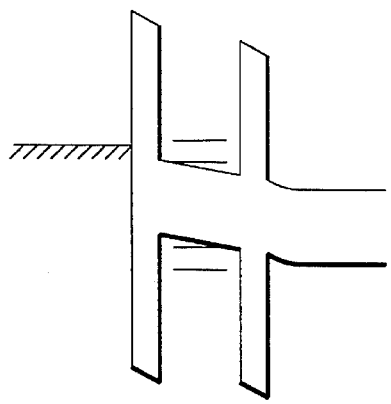

The width of quantum well 406 as 1.5 nm implies the edges of the lowest conduction subbands should lie at about 60 meV, 250 meV, 600 meV, and 1000 meV above the conduction band edge due to the quantized component of crystal momentum in the quantum well. The conduction band offset at the silicon/oxide interface for very thin oxide is about 2.9 eV (compared with 3.2 eV for thick oxide), the conduction band offset for the germanium/oxide interface is a little less but comparable, and the Fermi level/conduction band offset for the metal/oxide interface will depend upon the metal but also will be comparable to the silicon/oxide offset. For example, the aluminum/oxide offset for thick oxide is about 3.15 eV. FIGS. 5a–c represents the band diagram for electron conduction through diode 400. In FIG. 5a a small bias produces a flat band condition and yields essentially no current because none of the quantum well energy levels aligns with electrode Fermi level. In FIG. 5b a bias of approximately 100 mV across diode 400 yields the first resonant peak current; and in FIG. 5c a bias of approximately 150 mV across diode 400 leads to the first valley current. Spacing the doping of silicon 412 by undoped silicon layer 410 (of thickness a few nm) from the tunneling barriers avoids incorporating dopant atoms into the tunneling barrier where impurity-assisted tunneling can result. The high conductivity of n+ silicon 412 makes the majority of the applied bias between the electrodes appear across the tunneling barriers and quantum well. The dielectric constant of germanium is about four times that of oxide, so the applied voltage drop roughly splits into one third across the oxide barriers, one third across the quantum well, and one third across the undoped silicon abutting the oxide barrier. The breakdown voltage for oxide is on the order of 10 MV/cm, so to avoid breakdown currents which may destroy the oxide barriers, voltage drops must be less than about 3 volts across the entire double barrier neglecting depletion on the silicon side of the tunneling barriers.

Figure 6A:
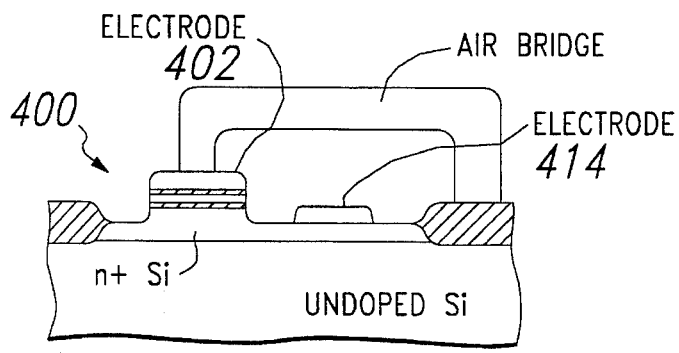
FIGS. 6a–c illustrate in cross sectional elevation views various structures of the preferred embodiment diode for circuit integration.
Figure 6B:
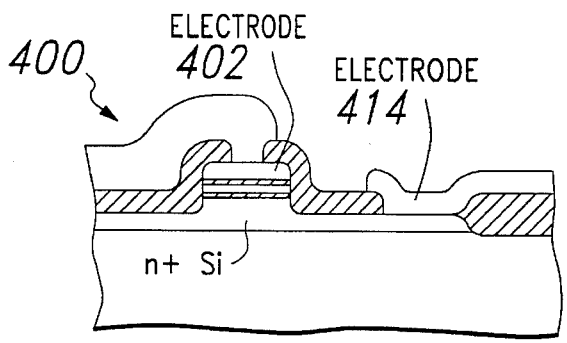

Diode 400 thus provides resonant tunneling in a system using only standard integrated circuit materials (silicon, germanium, and oxide) and may operate at room temperature. Diode 400 could have a mesa structure with an air bridge connection to electrode 402 or a mesa structure with sidewall insulator passivation which could support a connection to electrode 402 or a planar structure with surrounding planarizing insulator. See FIGS. 6a–c, respectively, which also show topside contacts for electrode 414 as could be used with integrated circuits including diodes 400 among the devices.

Preferred embodiment fabrication

FIGS. 7a–e illustrate in cross sectional elevation views a first preferred embodiment method of fabrication of diode 400 which includes the following steps:

(1) Begin with 25 mil thick, four-inch diameter, (100)-oriented silicon wafer 700. Insert wafer 700 into a molecular beam epitaxy (MBE) growth chamber and desorbany native oxide, and first epitaxially grow 0.1 μm of n+ doped silicon 702 as a buffer layer; a molecular beam of Sb4 provides in situ doping. Next, grow 5 nm of undopeal epitaxial silicon 704 at about 500° C. Then switch to epitaxial growth of germanium and grow 1.5 nm of undoped germanium 706. Lastly, switch back to epitaxial growth of silicon and grow 0.5 nm of undoped silicon 708. Note that silicon and germanium both have the diamond crystal structure with silicon having a lattice constant of about 0.5431 nm and germanium a lattice constant of about 0.5646 nm. Thus the germanium lattice constant is about 4% larger than that of silicon; but Ge layer 706 is thin enough to accommodate this mismatch with strain and maintain epitaxy. See FIG. 7a.

(2) Remove wafer 700 from the MBE growth chamber and insert it into a furnace and heat it to 500° C. in an oxygen atmosphere for 10 minutes to oxidize silicon 708 and some of germanium 706. See FIG. 7b which shows oxide 718 in place of silicon 708 and $GeO_x$ 716 in place of Ge 706. $GeO_x$ has an average x equal to about 0.7 but actually has an x value decreasing from about 2 to 0 in the direction into wafer 700. Oxide layer 718 will be about 1 nm thick (because oxidation of silicon roughly doubles the volume) and $GeO_x$ layer 718 will increase to about 2 nm thick.

Figure 7A:
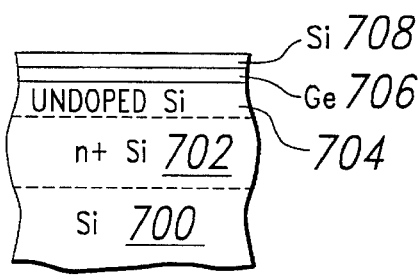
FIGS. 7a–d show fabrication steps of the first preferred embodiment diode.
Figure 7B:
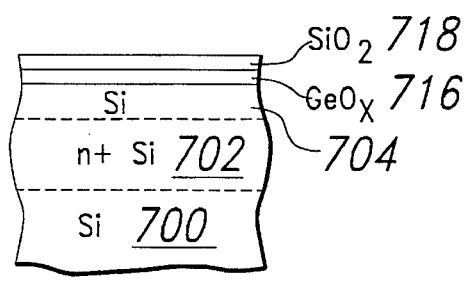
Figure 7C:
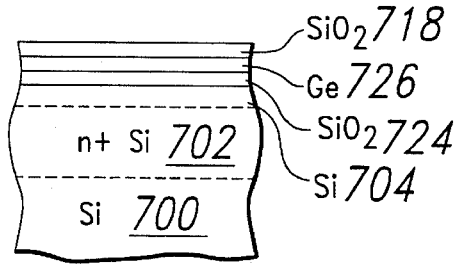

(3) Remove wafer 700 from the furnace and insert it into a rapid thermal annealing chamber and heat it to 800° C. for 10 seconds. This causes the oxygen to migrate (segregate) from $GeO_x$ 716 and oxidize abutting silicon 704. Because oxygen segregates in silicon to form silicon dioxide, the oxygen from $GeO_x$ 716 will form a well-defined oxide layer 724 about 1 nm thick and leave behind essentially crystalline Ge layer 726, although some intermediate compounds may occur at the interface. See FIG. 7c illustrating oxide layer 724 between Ge layer 726 and the remainder of Si layer 704. Ge layer 726 is basically the same as original Ge layer 706 (average thickness 1.5 nm) but now is between two oxide layers rather than between two silicon layers. The thickness of oxide layer 718 depends upon the original thickness of silicon layer 708, and the thickness of oxide layer 724 depends upon the amount of oxygen in $GeO_x$ layer 716 which, in turn, depends upon the length of the oxidation in step (2). The oxygen segregation to form oxide layer 724 may roughen the germanium-oxide interfaces.

(4) Remove wafer 700 from the rapid thermal annealing chamber and form top electrode 730 on oxide 718 by deposition of metal such as by sputtering or chemical vapor deposition (CVD). Metals such as aluminum or TiW (an alloy of 10% titanium and 90% tungsten) could be used because they stick to oxide without dissolving the oxide. Next, spin on photoresist and pattern it to define the location of top electrode 730, and etch the metal using the photoresist mask to form electrode 730. Alternatively, a liftoff formation of electrode 730 could be used; that is, spin on photoresist, pattern it to define the location of the top electrode, sputter deposit roughly 200 nm of metal such as aluminum or TiW and liftoff the photoresist plus the sputtered metal not forming the top electrode.

Figure 7D:
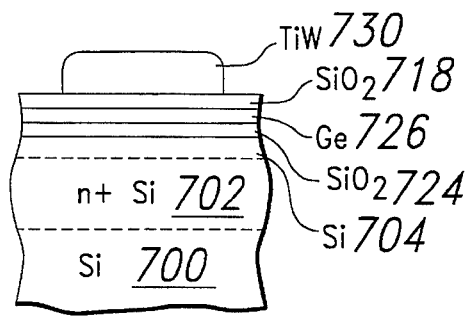

If further integrated circuit processing includes high temperature processes, such as local oxidation of the silicon substrate, then aluminum should be avoided and only refractory metals used for top electrode 730; see FIG. 7d. Top electrode 730 is 10 μm by 10 μm.

Figure 6C:
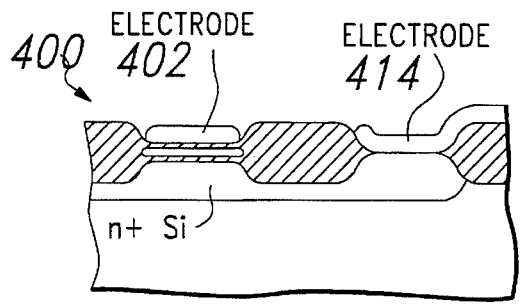

(5) Use top electrode 730 as a mask for etching to make a mesa structure. The etching could be a wet etches such as HF plus $HNO_3$ to remove oxides 718 and 724 plus silicon 704 and germanium 726. Timing the etch determines the height of the mesa. The isotropic nature of the etch is not significant due to the thinness of the oxide/Ge/oxide structure. Alternatively, a timed plasma etch with fluorides will remove oxide, silicon, and germanium to form the mesa and expose n+ Si 702 to allow for a bottom electrode. A local oxidation of silicon can be used to provide isolation oxide as illustrated in FIG. 6c; this oxidizes the mesa surface and passivates it. Note that a local oxidation of silicon uses high temperature thermal oxidation, so the rapid thermal annealing of step (3) could be omitted and the thermal oxidation step also provide the migration of the oxygen from GeO$_x$ 716 to silicon 704 to form oxide 724.

Figure 8A:
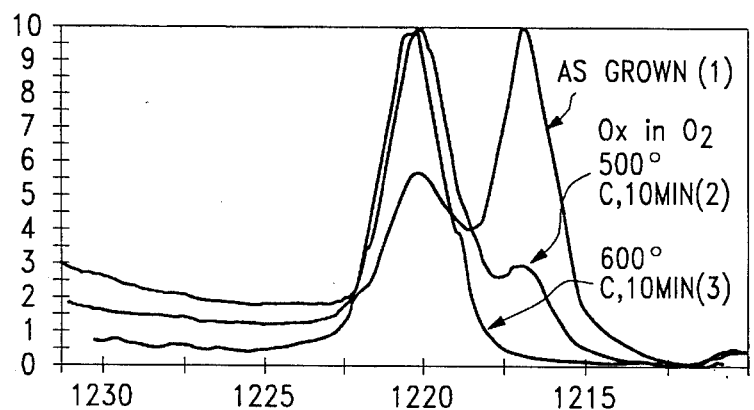
FIGS. 8a–d are analyses of the first preferred embodiment during processing.
Figure 8B:
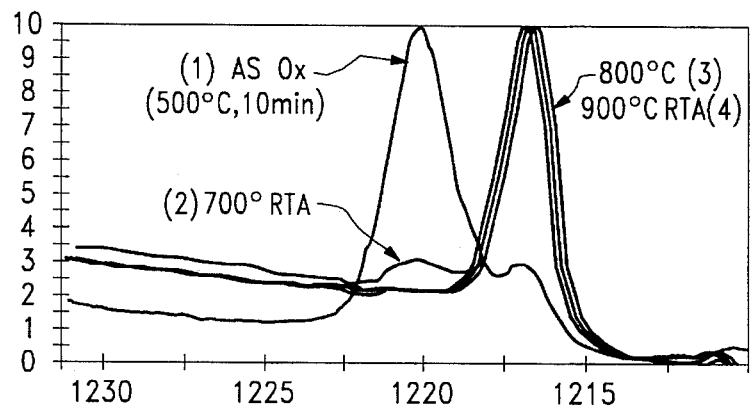

FIGS. 8a–b show x-ray photoelectron spectroscopy (XPS) analysis of the germanium during the foregoing processing. In particular, FIG. 8a shows the relative concentration of Ge and GeO, for (1) the as-grown germanium layer and (2)–(3) after oxidation for 10 minutes at 500° C. and at 600° C. The 600 ° C. oxidation almost completely converts the germanium to GeO$_2$, and this would lead to a oxide 724 thickness of at least 3 nm which may be too thick for practical tunneling current densities.

FIG. 8b shows the relative concentration of Ge and GeO$_2$ for (1) the 500° C. oxidation and (2)–(4) after rapid thermal anneals at 700° C., 800° C., and 900° C. Only the 700° C. anneal leaves noticeable GeO$_2$.

Figure 8C:
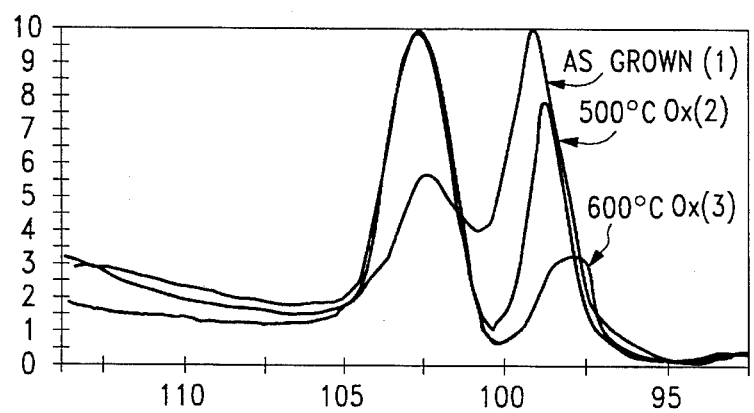
Figure 8D:
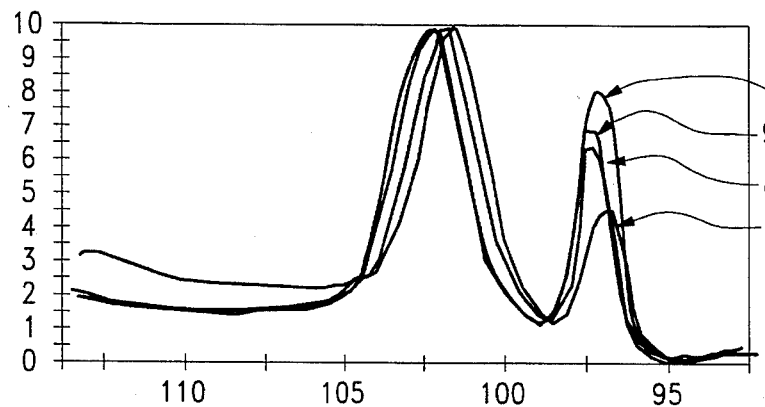

FIGS. 8c–d are the corresponding XPS analysis of the silicon during the processing. Note that XPS only analyzes the top few nm of a sample due to the internal scattering of the photoleectrons within the sample. In particular, FIG. 8c shows the relative concentration of Si and SiO$_2$ for (1) the as grown silicon and (2)–(3) after oxidation for 10 minutes at 500° C. and 600° C. Note that at 600° C. the amount of silicon detected is less than that at 500° C. In conjunction with FIG. 8a this indicates that the 600° C. oxidation has completely convened the germanium to GeO$_2$ and has begun oxidizing the underlying silicon. Thus the resulting oxide 724 will be thicker than 3 nm.

FIG. 8d shows the relative concentration of silicon and oxide for (1) the 500° C. oxidation and (2)–(4) after rapid thermal anneals at 700° C., 800° C., and 900° C.

Second preferred embodiment fabrication

FIGS. 9a–e illustrate in cross sectional elevation views a second preferred embodiment method of fabrication of diode 400 which includes the following steps which are analogous to the corresponding steps of the first preferred embodiment method:

(1) Begin with 25 mil thick, four-inch diameter, (100)-oriented silicon wafer 900. Epitaxially grow 1 μm thick n+ layer of silicon 902 on wafer 900 in an LPCVD reactor by decomposition of dichlorosilane with TMSb (Sb(CH$_3$)$_3$) for in situ antimony doping. Next, insert water 900 into an MBE growth chamber and desorb any native oxide, and grow 5 nm of undoped epitaxial silicon 904 at about 500° C. Then switch to epitaxial growth of germanium and grow a 1.5 nm thick epilayer of undoped germanium 906. Lastly, switch back to epitaxial growth of silicon and grow 1.5 nm of undoped silicon 908. Again, Ge layer 906 is thin enough to accommodate for the 4% lattice mismatch with strain and maintain epitaxy. See FIG. 9a.

(2) Insert wafer 900 into an ion implanter (high vacuum) and implant oxygen at 1 KeV and a dose of about $1\times10^{16}$ atoms/cm$^2$ and with a wafer temperature of about 600° C. With wafer 900 tilted about 7 degrees to limit channeling, the projected range of the oxygen atoms is about 2.2 nm with a projected straggle of about 1.6 nm and a slightly larger transverse straggle of about 1.8 nm. Thus the implanted oxygen is centered in the germanium and straggles into the silicon on either side roughly symmetrically. The high wafer temperature insures continuous annealing during implantation, so the top silicon surface remains single crystal. See FIG. 9b illustrating the implanted oxygen as silicon plus oxygen regions 915 and 917 and germanium plus oxygen region 916; of course, the oxygen concentration actually has roughly a Gaussian type distribution as a function of distance into wafer 900. Implantation provides for control of the quantity of oxygen, and thus control of the eventual thickness of the tunneling barriers without need for the process control of the nonimplanted preferred embodiments.

Figure 9A:
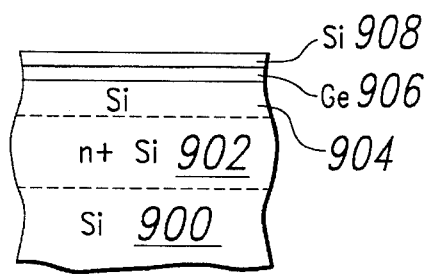
Figure 9C:
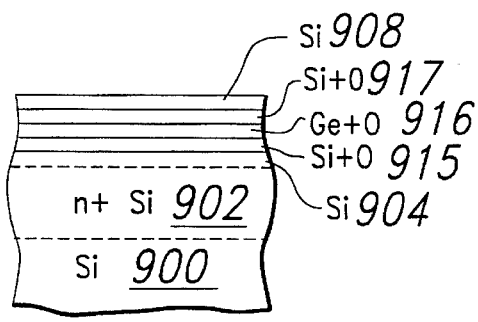
Figure 9C:
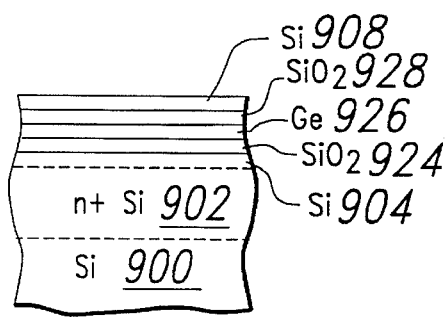
Figure 9D:
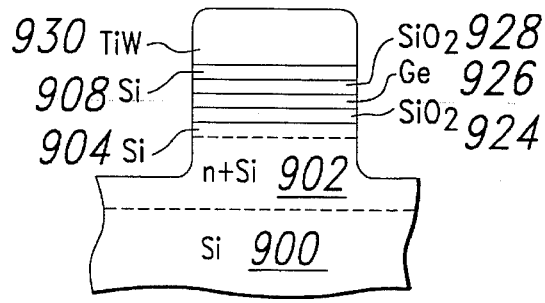
Figure 9E:
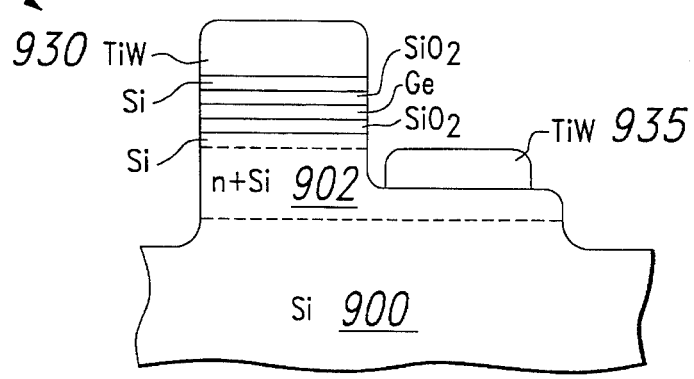

(3) Anneal wafer 900 at 1200° C. in an inert atmosphere for 1 hour. During the anneal the implanted oxygen segregates from the germanium plus oxygen layer 916 into the silicon plus oxygen layers 915 and 917 on either side of the germanium. The oxygen in silicon segregates to form oxide layers, each about 1 nm thick, abutting the germanium layer, and leaves about 1 nm of silicon on top of the top oxide layer. See FIG. 9c illustrating silicon 908 (about 1 nm thick), oxide 928 (1 nm), germanium 926 (1.5 nm), oxide 924 (1 nm), silicon 904 (about 4.5 nm), n+ silicon 902, and silicon wafer 900.

(4) Form top electrode 930 by metal deposition and patterning or by liftoff as in step (4) of the first preferred embodiment. Silicon layer 908 helps avoid damage to tunneling barrier oxide 928 during the deposition or liftoff. Again, use electrode 930 as a mask for mesa etching; see FIG. 9d. Use another metal deposition (liftoff) to form topside bottom electrode 935 on n+ silicon 902, and again mesa etch to isolate the resonant tunneling diode structure 950 from the remainder of wafer 900. Then standard silicon integrated circuit processing may be pertained on the remainder of wafer 900 to form other devices which may be connected to resonant tunneling diode 950. For example, gate oxide could be grown and polysilicon gates deposited to form CMOS circuitry on wafer 900 away from the resonant tunneling mesas, and the thermal oxidation to grow gate oxide could also provide a passivation of the mesa sidewall. Similarly, a collector, base, and emitter may be implanted or diffused into wafer 900 to form a bipolar transistor after the diodes have been fabricated.

Multiple diode preferred embodiment

Figure 10:
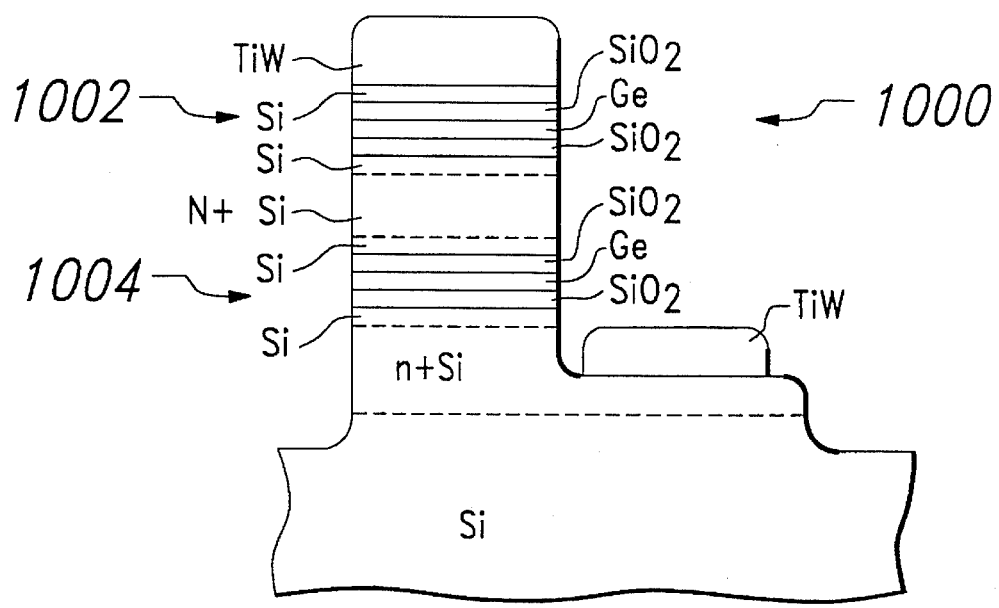
FIG. 10 is a cross sectional elevation view of a multiple diode preferred embodiment.

FIG. 10 illustrates in cross sectional elevation view third preferred embodiment germanium/oxide resonant tunneling diode stack 1000 which includes two separate resonant tunneling diodes 1002–1004 in series to yield a device with multiple resonant current peaks with hysteresis. Of course, more than two diodes could be used in series, and the diodes may have differing quantum well thicknesses for different spacing of the resonant current peaks.

Diode stack 1000 may be fabricated by a variant of the second preferred embodiment method. In particular, after the oxide formation of step (3) of the second preferred embodiment method (or, alternatively, after the oxygen implantation of step (2)), rather than forming the top electrode, return the wafer to an MBE machine and grow n+ doped silicon on the top silicon layer to a thickness of about 10 nm, then again grow 5 nm of undoped silicon, switch and grow germanium on the undoped silicon to a thickness of 1.5 nm, and lastly, again grow undoped silicon layer to a thickness of 1.5 nm on the germanium. Then again implant oxygen and high temperature anneal to segregate the implanted oxygen into 1 nm thick oxide tunneling barriers abutting both sides of the germanium layer. Lastly, form the electrodes.

Figure 11:
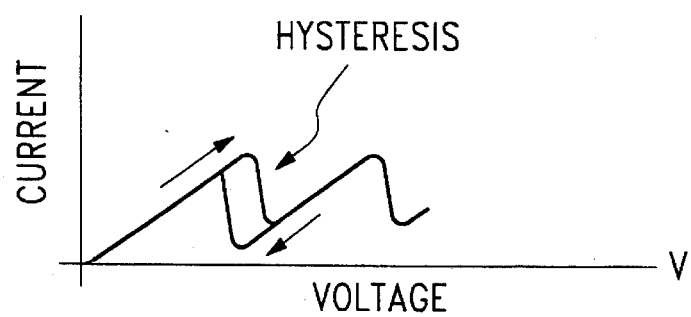
FIG. 11 illustrates the current-voltage dependence of the preferred embodiment of FIG. 10.

FIG. 11 illustrates the current hysteresis from diode stack 1000. In particular, presume the two diodes have the same structure. Then as the voltage V across the two diodes in series increases from 0, each diode sustains a voltage drop of V/2. However, when V/2 reaches the voltage from transition from peak current to valley current for a diode, the structure is unstable and one of the diodes switches into a high voltage/low current state (valley) with the other diode switching into a low voltage/low current state. Then as V decreases, this asymmetry of the diodes persists until V cannot sustain the valley current; see the hysteresis loop in FIG. 11. Conversely, as V increases from the first valley of FIG. 11, the current increases until it again approaches the first diode peak current and the structure again becomes unstable and the other diode switches to the high voltage/ low current state; that is, both diodes are operating with valley currents.

The cycle of grow silicon, germanium, silicon, then implant oxygen may be repeated to make as many resonant tunneling diodes in series as desired. The anneals to segregate the oxygen from the germanium into oxide tunneling barriers may be performed after each cycle or only at the end of all of the cycles.

Applications

Figure 1:
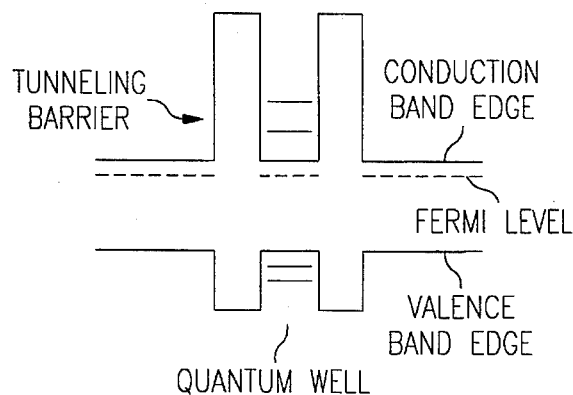
FIGS. 1–3b are band diagrams of a known resonant tunneling diode together with a current-voltage diagram.
Figure 2:
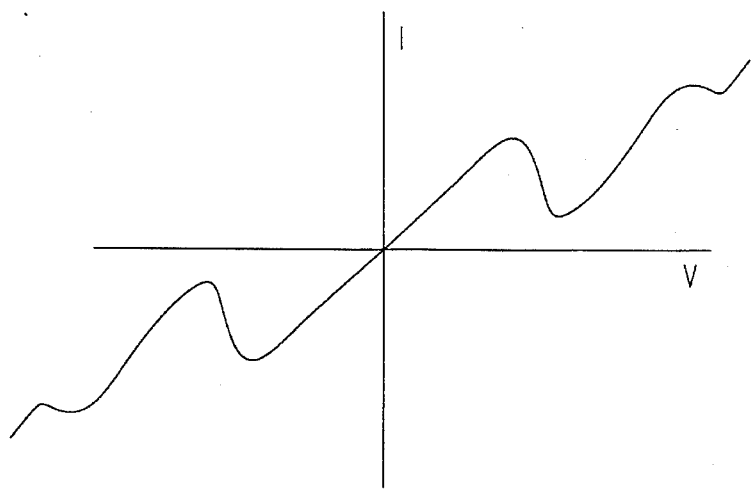
Figure 3A:
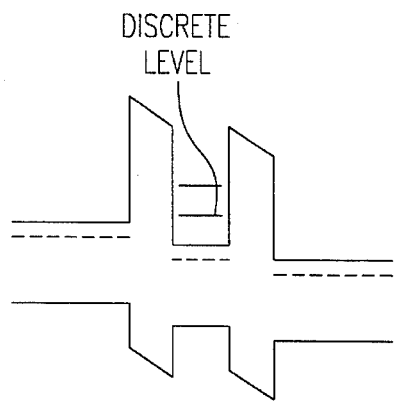
Figure 3B:
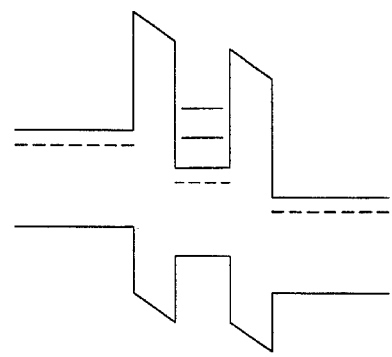
Figure 12A:
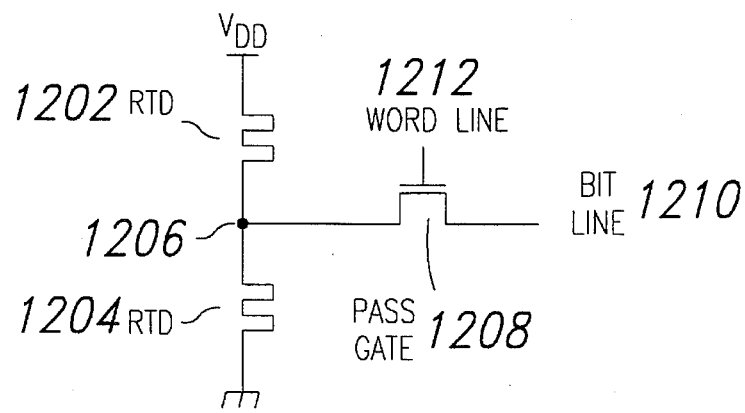
Figure 12C:
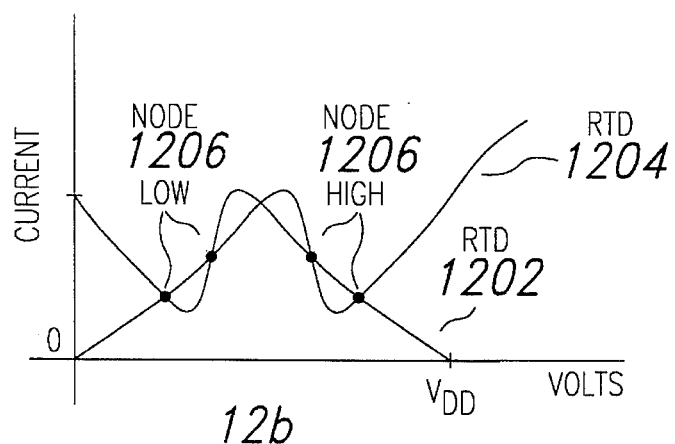
Figure 12C:
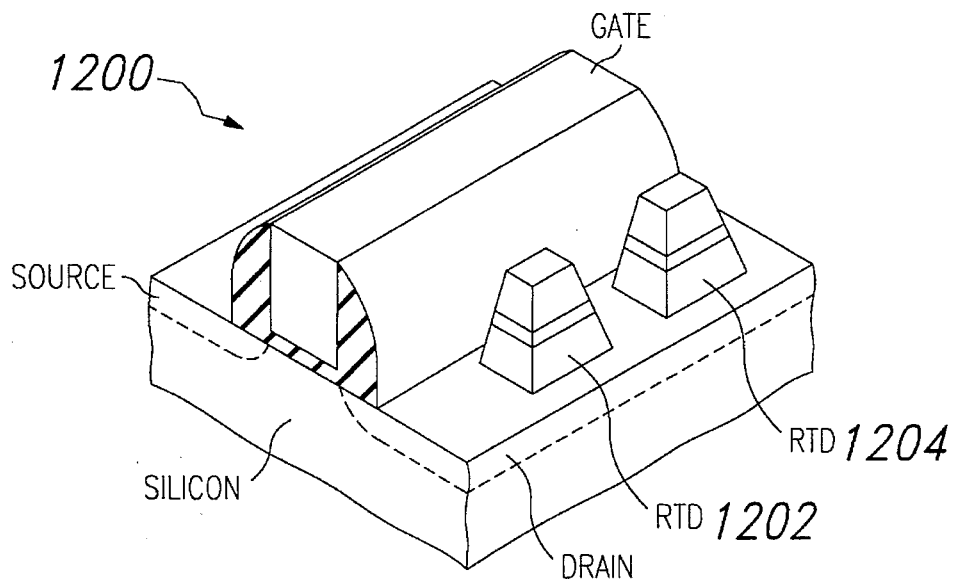

The preferred embodiments diodes may be incorporated into various structures such as the memory cell illustrated in FIGS. 12a–c. In particular, FIG. 12a schematically shows static random access memory (SRAM) cell 1200 as including resonant tunneling diodes 1202 and 1204 in series (RTD 1202 acts as the load for RTD 1204) and coupled to bitline 1210 by silicon field effect transistor pass gate 1208 controlled by the voltage on word line 1212. The bistability of node 1206 of cell 1200 derives from the bias voltage Vdd being set a little greater than the current valley of each RTD, so one RTD operates in its valley and the other RTD operates with small bias. FIG. 12b shows the superimposed current-voltage curves for RTDs 1202–1204 where each RTD has the characteristics illustrated in FIG. 2. The intersection points (a pair for the voltage on node 1206 close to Vdd or high and a pair for node 1206 low) indicate the stable series operation points. And accessing node 1206 through pass gate 1208 with a large driver to force node 1206 either high or low will force cell 1200 into a desired stable state; whereas, a sense amplifier accessing node 1206 through pass gate 1208 will detect the cell's state without disruption. Of course, a larger peak-to-valley ratio in the RTDs than that shown in FIG. 2 will make the high and low stable voltages for node 1206 closer to Vdd and 0, respectively.

FIG. 12c illustrates in perspective view the structure of FIG. 12a using a single silicon field effect transistor plus the preferred embodiment RTDs. Note that the parallel arrangement of the RTDs on the field effect transistor drain permits simultaneous fabrication with a mesa etch defining the locations of the RTDs. The silicon gate may be formed either prior to or after fabrication of the RTDs, although the previous description presumed fabrication after the RTD fabrication.

Modifications and advantages

The preferred embodiments may be varied in many ways while retaining one or more of the features of a quantum well containing a material from which oxygen will segregate to a tunneling barrier material upon processing.

For example, the dimensions could be varied with thinner or thicker tunneling barriers implying larger or smaller current densities, thinner or thicker quantum wells implying larger or smaller voltage separations of current resonances, and larger or smaller area mesas implying larger or smaller currents.

Heterojunction bipolar transistors with resonant tunneling diodes imbedded in the emitters and with silicon-germanium bases or homojunctions bipolar transistors with resonant tunneling diodes imbedded in the emitters may be fabricated in the same manner. Namely, form the resonant tunneling diode in an emitter by a segregation of oxygen from a germanium layer to create silicon oxide tunneling barriers enclosing a germanium quantum well.

In transistors and circuits the resonant tunneling structures have an advantage of increasing the amount of logic or memory performed per unit area. For example, resonant tunneling bipolar transistors consisting of resonant tunneling elements in the emitter of conventional bipolar transistors have been used to construct full adder circuits with one third the usual number of transistors and one third the gate delay of conventional technology.

What is claimed is:

1. A resonant tunneling diode, comprising:
   (a) first and second tunneling barriers, said first tunneling barrier including a silicon-oxygen compound;
   (b) a quantum well between said first and second tunneling barriers, said quantum well including germanium;
   (c) a first terminal abutting said first tunneling barrier; and
   (d) a second terminal abutting said second tunneling barrier.

2. The resonant tunneling diode of claim 1, wherein:
   (a) said first terminal includes crystalline silicon.

3. The resonant tunneling diode of claim 2, wherein:
   (a) said first tunneling barrier and said quantum well form an interface characterized by migration of oxygen from said quantum well into said tunneling barrier.

4. The resonant tunneling diode of claim 2, wherein:
   (a) said second tunneling barrier includes said silicon-oxygen compound; and
   (b) said second terminal includes metal.

5. The resonant tunneling diode of claim 1, wherein:
   (a) said silicon-oxygen compound is essentially silicon dioxide.

* * * * *